(12) United States Patent  
Choi

(10) Patent No.: US 9,461,645 B2  
(45) Date of Patent: Oct. 4, 2016

(54) METHOD FOR FABRICATING TOUCH PANEL, TOUCH PANEL, AND ELECTRONIC DEVICE HAVING THE TOUCH PANEL

(71) Applicant: Samsung Electronics Co., Ltd., Suwon-si, Gyeonggi-do (KR)

(72) Inventor: Jong-Mun Choi, Yangsan-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 232 days.

(21) Appl. No.: 14/272,864

(22) Filed: May 8, 2014

(65) Prior Publication Data

US 2015/0167177 A1 Jun. 18, 2015

(30) Foreign Application Priority Data

Dec. 13, 2013 (KR) .................. 10-2013-0155793

(51) Int. Cl.
*H01H 13/70* (2006.01)
*H03K 17/96* (2006.01)
*G06F 3/044* (2006.01)

(52) U.S. Cl.
CPC .......... *H03K 17/9618* (2013.01); *G06F 3/044* (2013.01); *G06F 2203/04103* (2013.01); *G06F 2203/04112* (2013.01); *H03K 2217/96015* (2013.01)

(58) Field of Classification Search
CPC ............... H03K 17/9618; H03K 2217/96015
USPC ....................................................... 200/600
See application file for complete search history.

(56) References Cited

U.S. PATENT DOCUMENTS

| | | | | |
|---|---|---|---|---|
| 7,986,152 | B2 * | 7/2011 | Philipp | G06F 3/044 324/658 |
| 8,970,541 | B2 * | 3/2015 | Edwards | G06F 3/044 324/656 |
| 9,081,457 | B2 * | 7/2015 | Solven | G06F 3/044 |
| 2008/0246496 | A1 * | 10/2008 | Hristov | G06F 3/044 324/686 |
| 2011/0134073 | A1 | 6/2011 | Ahn | |
| 2012/0138929 | A1 | 6/2012 | Jung et al. | |
| 2013/0187871 | A1 | 7/2013 | Kurashima | |

FOREIGN PATENT DOCUMENTS

| | | |
|---|---|---|
| EP | 2405328 A2 | 1/2012 |
| KR | 10-2010-0004827 A | 1/2010 |
| KR | 10-2010-0040654 A | 4/2010 |
| KR | 10-2013-0049044 A | 5/2013 |
| WO | 2011/139547 A2 | 11/2011 |

* cited by examiner

*Primary Examiner* — Kyung Lee  
(74) *Attorney, Agent, or Firm* — Jefferson IP Law, LLP

(57) ABSTRACT

A method for fabricating a touch panel, a touch panel, and an electronic device having the touch panel are provided. The touch panel includes a window member including a view area and a bezel area surrounding the view area, a sensor layer formed in the view area on a surface of the window member and including a sensor pattern for detecting a user input, a light blocking layer formed in the bezel area on the surface of the window member, a wiring layer formed on a surface of the light blocking layer and connected to the sensor pattern, and a barrier layer formed on the surface of the light blocking layer or a surface of the wiring layer.

18 Claims, 13 Drawing Sheets

METHOD FOR FABRICATING TOUCH PANEL, TOUCH PANEL, AND ELECTRONIC DEVICE HAVING THE TOUCH PANEL

CROSS-REFERENCE TO RELATED APPLICATION(S)

This application claims the benefit under 35 U.S.C. §119 (a) of a Korean patent application filed on Dec. 13, 2013 in the Korean Intellectual Property Office and assigned Serial No. 10-2013-0155793, the entire disclosure of which is hereby incorporated by reference.

TECHNICAL FIELD

The present disclosure relates to a touch panel. More particularly, the present disclosure relates to a method for fabricating a touch panel, a touch panel fabricated by the method, and an electronic device having the touch panel.

BACKGROUND

A touch panel is an input device that senses the position of a touch made by a user's finger or a tool. Depending on its operating principles, a touch panel is categorized into a resistive type, a capacitive type, an InfraRed (IR) type, a Surface Acoustic Wave (SAW) type, an ElectroMagnetic (EM) type, and an ElectroMagnetic Resonance (EMR) type.

In general, a touch panel includes a sensor layer that senses a touch of an input means (e.g., a finger, a stylus pen, or the like) and that is connected to a controller via wiring electrodes. The controller senses a variation in an output of the touch panel according to a touch of the input means and determines the position of the touch on the touch panel.

The touch panel is typically mounted to an inner surface of a window member that is located above a display. In the touch panel, the sensor layer is disposed in a view area that transmits a screen of the display and the wiring electrodes are disposed in a bezel area defined around the periphery of the view area. The engagement structure of the window member, the wiring electrodes, and the like may be shielded by a light blocking layer formed in the bezel area.

The light blocking layer may be fabricated using a Black Matrix (BM) scheme or a printing scheme. A light blocking layer fabricated using the BM scheme has a very flat, uniform surface, thereby suppressing the occurrence of an open-circuit. However, the color of the light blocking layer is limited to black. Although the light blocking layer may be fabricated using the BM scheme by adding a pigment in order to diversify the design and color of an electronic device, the surface of the light blocking layer may become rough and is vulnerable to formation of foreign materials or bumps after the pigment is dried and hardened. On the other hand, if a light blocking layer is fabricated in the printing scheme, the design and color of an electronic device may be diversified. However, while the printing scheme uses ink and provides various shades other than black, the light blocking layer has a rough surface that may include foreign materials or bumps.

Diverse Color, Material, Finishing (CMF) designs are available to a window member of the related art by forming a light blocking layer. However, electrode wires may not be formed partially or wholly due to surface defects of the light blocking layer. As a result, the electrode wires may have an increased line resistance or may be vulnerable to an open-circuit. If a touch panel is configured in a window member with an increased line resistance or open-circuit of electrode wires, a signal output from a sensor layer may be delayed or lost, thereby decreasing touch sensitivity or an operation speed. Accordingly, there is a need for an improved method for fabricating a touch panel.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method for fabricating a touch panel, in which electrode wires of good quality are formed despite surface defects of a light blocking layer, a touch panel fabricated by the method, and an electronic device having the touch panel.

In accordance with an aspect of the present disclosure, a touch panel is provided. The touch panel includes a window member including a view area and a bezel area surrounding the view area, a sensor layer formed in the view area on a surface of the window member and including a sensor pattern for detecting a user input, a light blocking layer formed in the bezel area on the surface of the window member, a wiring layer formed on a surface of the light blocking layer and connected to the sensor pattern, and a barrier layer formed on the surface of the light blocking layer or a surface of the wiring layer.

In accordance with another aspect of the present disclosure, a method for fabricating a touch panel is provided. The method includes forming a light blocking layer around a view area on a surface of a window member, forming a bridge layer of a transparent conductor on the surface of the window member, forming a metal layer on a surface of the bridge layer on the light blocking layer, forming bridges in the view area of the window member by partially removing the bridge layer, and forming an insulation layer in the view area and a surface of the metal layer.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
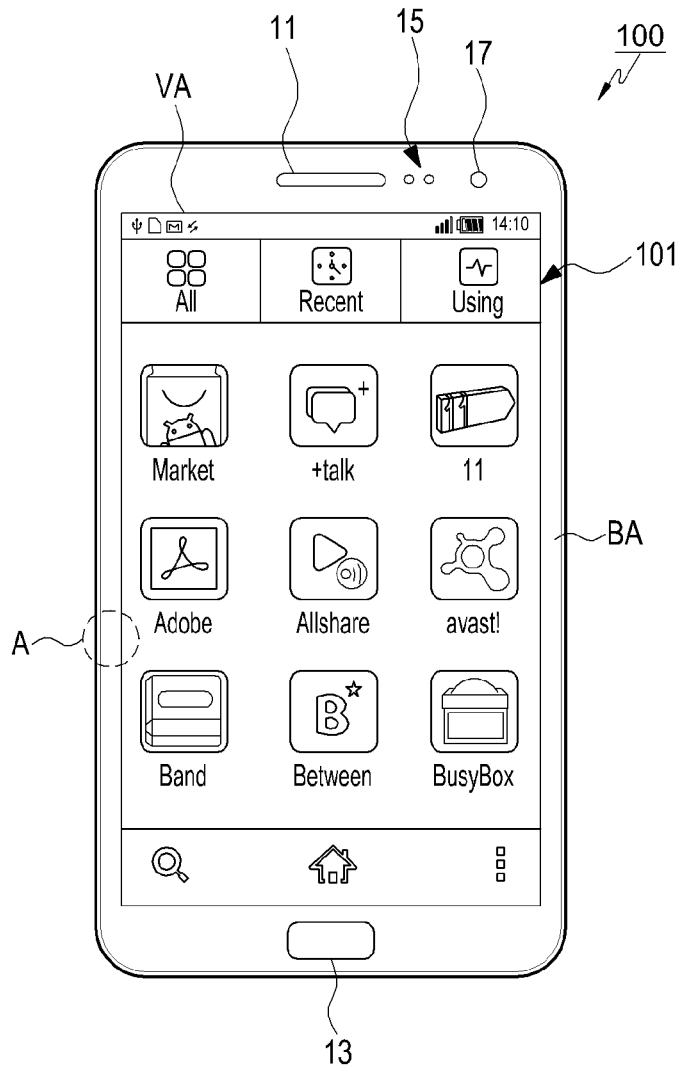
FIG. 1 illustrates an electronic device having a touch panel according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Relative terms such as 'front surface', 'rear surface', 'top surface', 'bottom surface', and the like are defined with respect to what is shown in the drawings and can be replaced with ordinal numbers such as 'first', 'second', and the like. The ordinal numbers are used in order to avoid confusion among components and do not limit the order or number of the components.

An electronic device according to various embodiments of the present disclosure may be any device with a touch panel. For example, the electronic device may be implemented as a terminal, a portable terminal, a mobile terminal, a communication terminal, a portable communication terminal, a portable mobile terminal, a display device, or the like. The electronic device may be any of a smart phone, a portable phone, a navigator, a game console, a TeleVision (TV), an in-vehicle head unit, a laptop computer, a tablet Personal Computer (PC), a Portable Multimedia Player (PMP), a Personal Digital Assistant (PDA), and the like. The electronic device may be configured as a pocket-sized portable communication terminal having wireless communication functionality. The electronic device may be a flexible device or a flexible display device.

The electronic device may communicate with an external electronic device such as a server or the like and may operate in conjunction with the external electronic device. For example, the electronic device may transmit an image captured by a camera and/or position information detected by a sensor unit to a server over a network. The network may be, but is not limited to, a mobile or cellular communication network, a Local Area Network (LAN), a Wireless LAN (WLAN), a Wide Area Network (WAN), the Internet, a Small Area Network (SAN), or the like.

FIG. 1 illustrates an electronic device having a touch panel according to an embodiment of the present disclosure.

Referring to FIG. 1, an electronic device 100 may include a display device 101, an Input/Output (I/O) module, and the like.

The display device 101 may output text information or image information on a screen. A structure of the display device 101 will be described in more detail later with reference to FIG. 2.

The I/O module receives a user input or outputs stored information. The I/O module may include a speaker 11, a button 13, a microphone, a vibration motor, a connector, a keypad, and the like. The display device 101 is a kind of output module and thus may output text information or image information as described above. If a touch panel is incorporated into the display device 101, the display device 101 may also serve as an input module.

The electronic device 100 may further include a sensor unit 15 that detects ambient environment information, and a camera 17 that captures an image or a video. The sensor unit 15 may include at least one sensor that detects states of the electronic device 100 (e.g., position, bearing, motion, and the like), for example, a proximity sensor that senses proximity of a user, a luminance sensor that detects an ambient light intensity, a motion/bearing sensor that detects rotation, acceleration, deceleration, and vibration, and the like.

The electronic device 100 may include a storage unit, a communication unit, a controller, and the like.

The storage unit may store data for executing applications such as images required to provide a Graphical User Interface (GUI), data or a database such as text, background images (e.g., a menu screen, an idle screen, and the like) required to operate the electronic device 100, operation programs, and the like. The storage unit may include a volatile or non-volatile medium as a machine-readable medium (e.g., a computer-readable medium).

The communication unit connects the electronic device 100 to a server or an external electronic device directly or through a network. The communication unit may transmit and receive data using a wired or wireless channel via an external communication line or in the air and transmit the received data in the controller or store the received data in the storage unit. The communication unit may include a mobile communication module, a WLAN module, a short-range communication module, and/or the like.

The controller provides overall control to the electronic device 100. The controller executes an application according to a user input and the application executes a program according to a user input. The user input includes an input from the I/O module, the touch panel, the sensor unit 15, or the camera 17. The controller may include a bus for information communication and a processor connected to the bus, for information processing. The controller may include a Central Processing Unit (CPU), an Application Processor (AP), or the like.

The controller may further include a Random Access Memory (RAM) connected to the bus, to temporarily store information requested by the processor, and a Read Only Memory (ROM) connected to the bus, to store static information requested by the processor.

Figure 2:
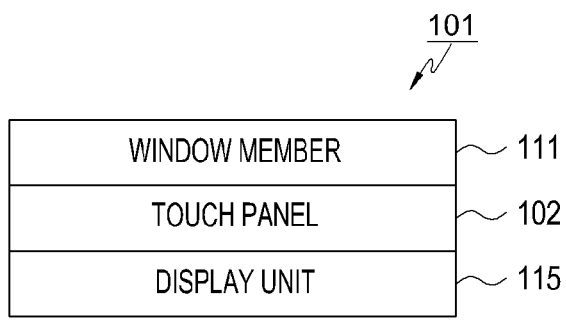
FIG. 2 illustrates a structure of a display device in an electronic device according to an embodiment of the present disclosure.

With reference to FIG. 2, a structure of the display device 101 will be described in greater detail.

FIG. 2 illustrates a structure of a display device in an electronic device according to an embodiment of the present disclosure.

Referring to FIG. 2, the display device 101 may display an image or data received from the controller and may include a touch panel 102 to thereby operate as an input module. The display device 101 may include a window member 111 and a display unit 115, and the touch panel 102 may be interposed between the window member 111 and the display unit 115. The window member 111 is disposed on the front surface of the electronic device 100 and may transmit a screen output from the display unit 115, while protecting the display unit 115.

The touch panel 102 may be formed on a base substrate such as a film formed of polyimide or the like and attached to the window member 111. Or the touch panel 102 may be incorporated into the window member 111 by directly forming the touch panel 102 on one surface of the window member 111, for example, an inner surface of the window member 111. In various embodiments of the present disclosure, the touch panel 102 is incorporated onto the inner surface of the window member 111, by way of example.

If a user input means such as a finger or a stylus pen approaches within a threshold distance to the surface of the window member 111, the touch panel 102 may output user input information indicating input coordinates and an input state to the controller.

The window member 111 having the touch panel 102 incorporated in it may be attached to the display unit 115 by means of a light-transmittable adhesive layer. The adhesive layer may be formed of an insulation material such as an Optical Clear Adhesive (OCA) tape, an adhesive material, a gluing material, an UltraViolet (UV) curable resin, and the like. However, there is no need for necessarily attaching the window member 111 to the display unit 115.

Figure 3:
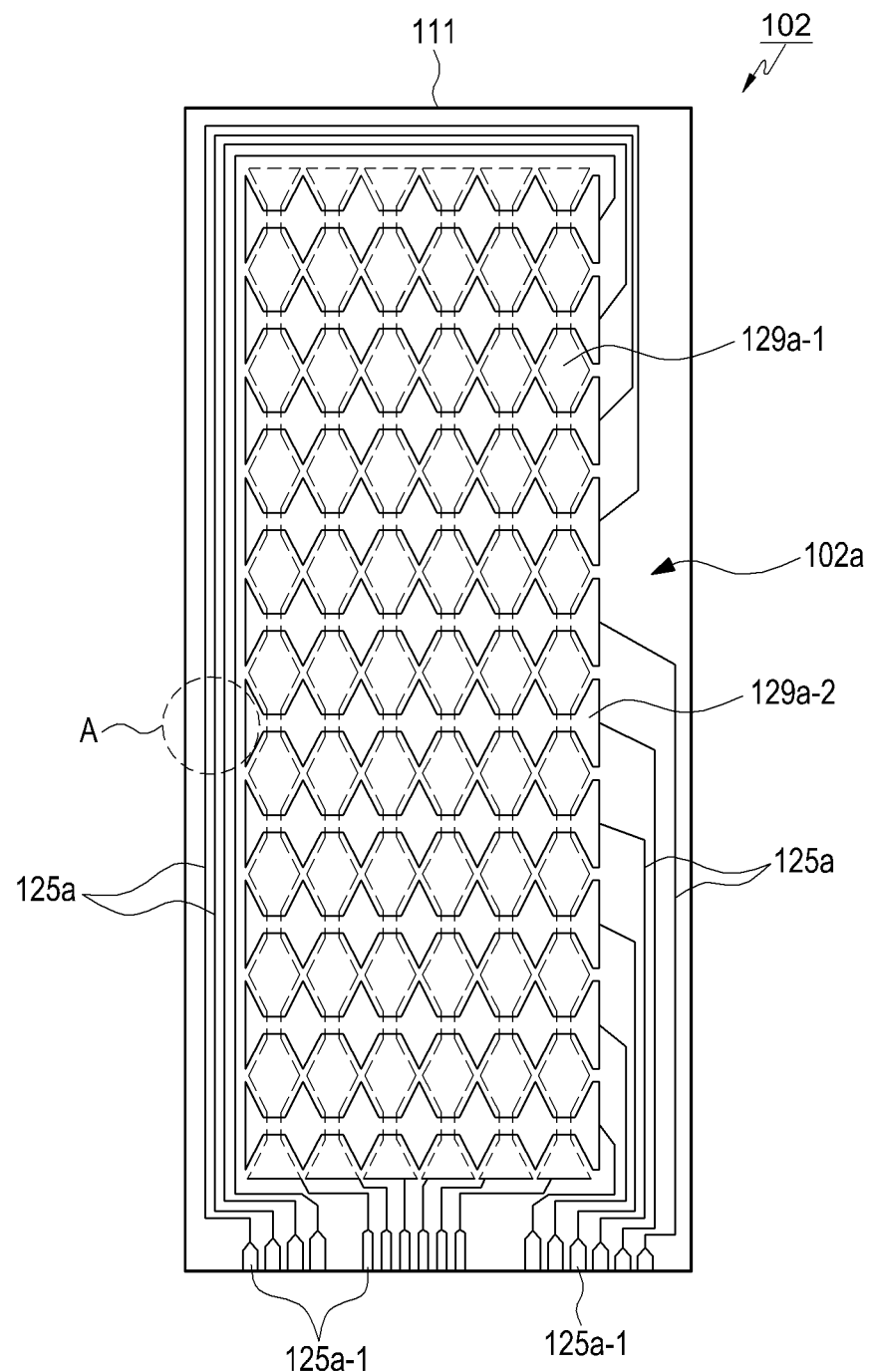
FIG. 3 is a plan view of a touch panel according to an embodiment of the present disclosure.
Figure 4:
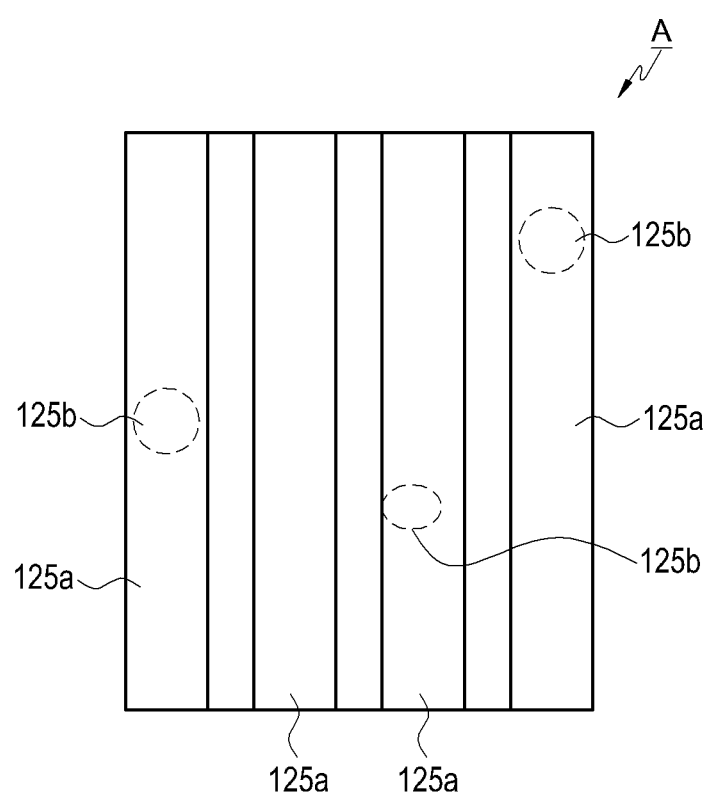
FIG. 4 is an enlarged view of an area "A" in the touch panel illustrated in FIG. 3 according to an embodiment of the present disclosure.
Figure 5:
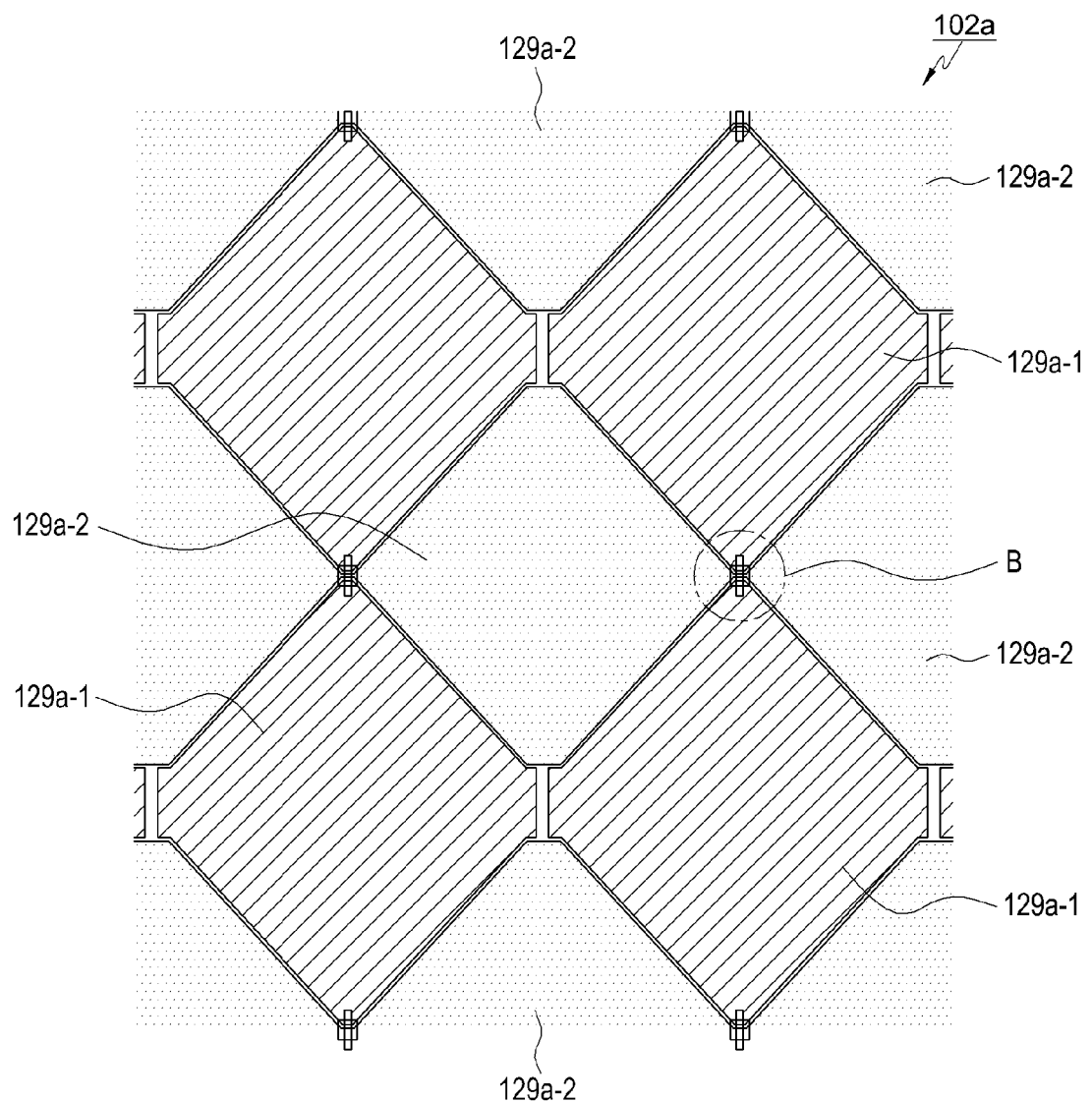
FIG. 5 is a partial enlarged view of a sensor layer in a touch panel according to an embodiment of the present disclosure.
Figure 6:
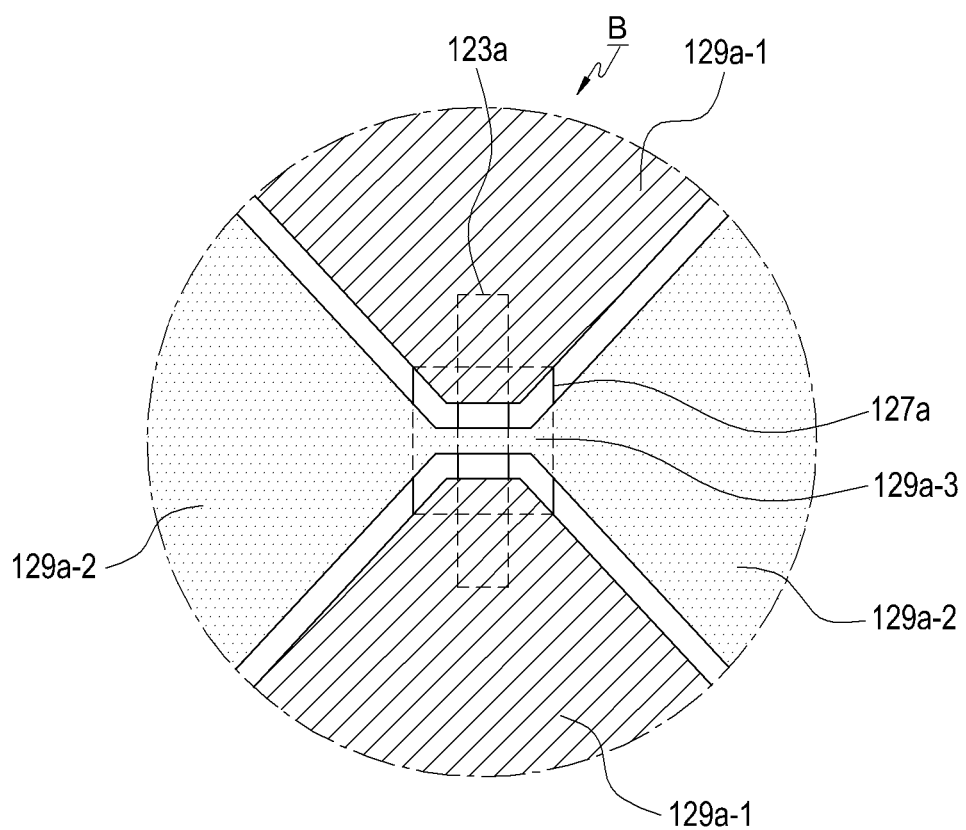
FIG. 6 is an enlarged view of an area "B" in the touch panel illustrated in FIG. 5 according to an embodiment of the present disclosure.
Figure 7:
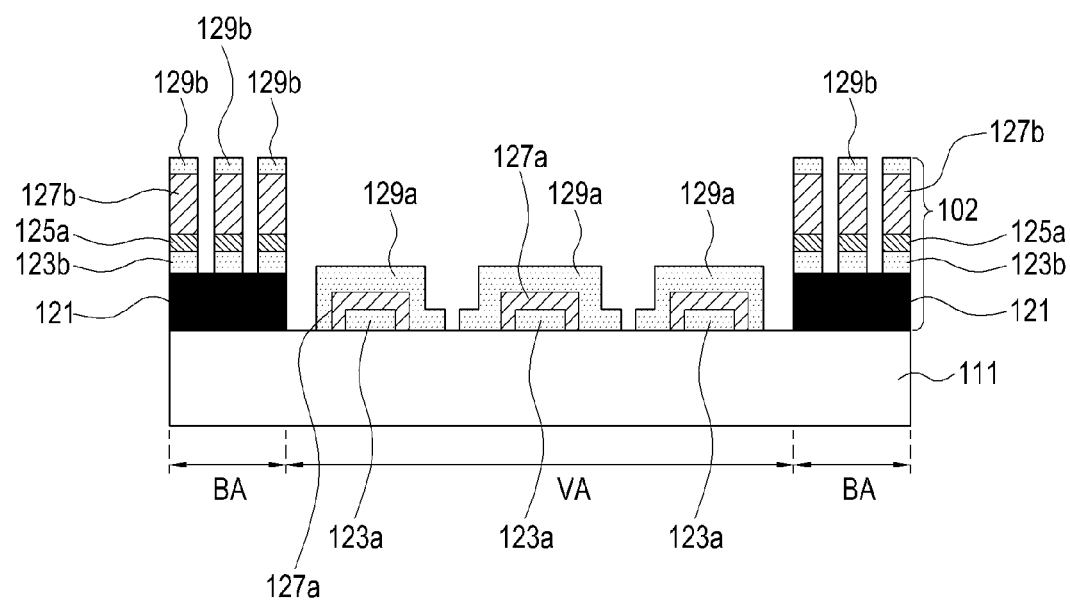
FIG. 7 is a sectional view of a touch panel according to an embodiment of the present disclosure.

FIG. 3 is a plan view of a touch panel according to an embodiment of the present disclosure and FIG. 4 is an enlarged view of an area "A" in the touch panel illustrated in FIG. 3 according to an embodiment of the present disclosure. FIG. 5 is a partial enlarged view of a sensor layer in a touch panel according to an embodiment of the present disclosure and FIG. 6 is an enlarged view of an area "B" in the touch panel illustrated in FIG. 5 according to an embodiment of the present disclosure. FIG. 7 is a sectional view of a touch panel according to an embodiment of the present disclosure.

In more detail, FIG. 3 illustrates a wiring structure of the touch panel 102. Herein, it is to be noted that a part of the structure of the touch panel 102, such as insulation layers 127a or a barrier layer 127b, is not shown.

Referring to FIGS. 3 to 7, the touch panel 102 may be configured on one surface of the window member 111 and may include a sensor layer 102a formed in a View Area (VA) of the window member 111, a light blocking layer 121 formed in a Bezel Area (BA) of the window member 111, a wiring layer 123b and 125a formed on a surface of the light blocking layer 121, and a barrier layer 127b formed on a surface of the wiring layer 123b and 125a.

The sensor layer 102a includes sensor patterns 129a formed on the surface of the window member 111, to detect or sense a user input. The user input may be created by a touch of an input means such as a body part including a finger or a stylus pen. The sensor layer 102a may sense a touch of the input means based on a variation in capacitance, resistance, voltage, or current and provide a user input associated with the touch to the controller. While the sensor layer 102a is positioned in the VA of the window member 111, a sensor layer may also be formed in the BA depending on implementation.

For example, a sensor layer including a home key, a menu key, a back key, and the like may be configured outside the VA, for example, in the BA in the electronic device 100. The home key may execute a return to a preset home screen, the menu key may invoke a menu of an ongoing application, and the back key may execute a return to a previous screen. Besides, the sensor layer may be provided in the BA to configure a hot key for screen activation/deactivation and navigation keys for adjustment of display brightness, adjustment of sound volume, movement to a menu, and the like.

The sensor patterns 129a formed in the sensor layer 102a may include first sensor patterns 129a-1 serially connected in a first direction through bridges 123a, and second sensor patterns 129a-2 serially connected in a second direction perpendicular to the first direction. The first sensor patterns 129a-1 and the second sensor patterns 129a-2 may intersect with each other perpendicularly. The sensor patterns 129a may intersect with each other at a plurality of points. For example, the second sensor patterns 129a-2 may be connected serially through a plurality of connectors 129a-3 and the connectors 129a-3 may intersect with the bridges 123a. An insulation layer 127a may be interposed between each connector 129a-3 and a bridge 123a corresponding to the connector 129a-3 to insulate between the connector 129a-3 and the bridge 123a. The insulation layer 127a may be implemented as one or more layers, and the insulation layers 127a may be formed simultaneously with the barrier layer 127b, for example, in the same process. Since the bridges 123a and the sensor patterns 129a of the sensor layer 102a are positioned in the VA, the bridges 123a and the sensor patterns 129a may be formed of a transparent conductor or a metal mesh. If implemented using a metal mesh, the metal mesh is formed of a size that is not visible to the human eye. Hereinbelow, the term 'transparent conductor' may mean a material that is as conductive as the metal mesh and that is too thin to be visible to the human eye.

The light blocking layer 121 may be formed in the BA that surrounds the VA of the window member 111. The light blocking layer 121 may be a printed layer formed using a screen-printing ink containing a resin such as PolyEthylene (PE), acryl, PolyUrethane (PU), or the like. The screen-printing ink used for forming the light blocking layer 121 may further contain a pigment with which to diversify the Color, Material, Finishing (CMF) of an electronic product to which the window member 111 is mounted according to a design specification of the electronic product. During printing, foreign materials may attach to the light blocking layer 121 or defects such as bumps may be created on the surface of the light blocking layer 121 due to an additive such as a pigment.

The wiring layer 123b and 125a may be formed on the surface of the light blocking layer 121. The wiring layer 123b and 125a may be formed by depositing a transparent conductor on the surface of the light blocking layer 121 during formation of the sensor layer 102a. The wiring layer 123b and 125a transfers a signal received from the sensor layer 102a or a signal directed to the sensor layer 102a. An additional conductive metal such as copper or gold may further be deposited or otherwise formed on the transparent conductor layer. As a result, the line resistance of the wiring layer 123b and 125a may be reduced.

Referring to FIG. 4, the wiring layer 123b and 125a is a conductive metal or transparent conductor layer forming first wires and remaining on the light blocking layer 121 after the conductive metal and the transparent conductor layer are partially removed from the light blocking layer 121. That is, first wires may be formed with the wiring layer 123b and 125a. Thus, the first wires may be formed of the transparent conductor and the conductive metal used for forming the wiring layer 123b and 125a. In various embodiments of the present disclosure, the reference numeral '125a' is used to denote 'the first wires'.

Despite the presence of surface defects 125b such as bumps on the light blocking layer 121, the touch panel 102 may still keep the conductive metal or the transparent conductive layer in various embodiments of the present disclosure. Therefore, the touch panel 102 may be free of defects caused by the line resistance or an open-circuit of the wiring layer 123b and 125a in various embodiments of the present disclosure.

To partially remove the conductive metal or the transparent conductor layer, etching such as wet etching using an etching mask may be used. A photoresist is deposited on a surface of the conductive metal or the transparent conductor layer to form an etching mask during etching. The conductive metal or the transparent conductor layer may be partially removed by dry etching. An appropriate etching scheme may be selected in consideration of a fabrication environment or cost effectiveness.

The conductive metal or the transparent conductor layer may be formed on the surface of the light blocking layer 121 by deposition or plating. Herein, the conductive metal or the transparent conductive layer may be subjected to conformal coating. In conformal coating, a coating layer is formed to a uniform thickness in conformance to the topology of a coated surface. On the other hand, deposition of a photoresist for etching leads to non-conformal coating characteristics. Thus, a part with surface defects such as bumps has a small thickness or is not coated, relative to a normal part. In a solution coating scheme based on photoresist deposition, a coating layer may be formed to about 3 μm by slit coating or roll coating. It is observed that surface defects such as bumps are formed in a range of 2 to 13 μm on the surface of the light blocking layer 121.

Therefore, if surface defects such as bumps are formed at a wiring position on the light blocking layer, the bumps protrude outward on a photoresist layer and the conductive metal and the transparent conductive layer corresponding to the wiring position may be etched and lost during etching. As a result, the line width of wires may be reduced or an open-circuit may be created in a part having the surface defects.

In various embodiments of the present disclosure, since the barrier layer 127b is formed by depositing an insulation layer, for example, a photosensitive organic insulation layer on the conductive metal or the transparent conductive layer before the first wires 125a are formed, reduction of the line width or open-circuit of the first wires 125a caused by surface defects may be prevented in the touch panel 102. This fabrication method will be described later in greater detail with reference to FIG. 8.

Pad electrodes 125a-1 may be formed of the conductive metal or the transparent conductive layer on the light blocking layer 121. The pad electrodes 125a-1 may connect the touch panel 102 to the controller and other components of the electronic device 100. The first wires 125a may be extended from the sensor patterns 129a and thus connect the pad electrodes 125a-1 to the sensor patterns 129a.

The barrier layer 127b may be formed on the surface of the wiring layer 123b and 125a on the light blocking layer 121. As noted from a section of the barrier layer 127b illustrated in FIG. 7, the barrier layer 127b includes a plurality of pieces. This structure of the barrier layer 127b may reduce stress on a boundary surface between the barrier layer 127b and the light blocking layer 121, caused by a thermal expansion coefficient difference. The stress on the boundary surface is proportional to an area over which the two different layers contact. In various embodiments of the present disclosure, since the barrier layer 127b includes a plurality of pieces, by reducing the contact area and making each piece displaceable in correspondence with the thermal expansion of the light blocking layer 121, the stress on the boundary surface may be reduced in the touch panel 102.

The barrier layer 127b may be formed of a photosensitive organic insulation layer. For the photosensitive organic insulation layer, a material having low electrical conductivity and high breakdown field is required. For example, the barrier layer 127b may be formed of an organic insulation material such as an alkali soluble binder resin. The alkali soluble binder resin may be, for example, acrylic copolymer, polyethylene copolymer, polystyrene copolymer, or the like. When needed, to render the insulation layer chemical-proof and etch-proof, cyclic hexane having an alkyl cyclic structure, curing epoxy, or an oxetane structure may be used. Besides, the insulation layer for the barrier layer 127b may be formed of novolac resin made from aldehyde, phenol or cresol, polyvinyl alcohol, polyvinyl alkyl ether, styrene/acrylic acid copolymer, copolymer of methacrylic acid and methacrylic ester, hydroxy styrene polymer, polyvinyl hydroxyl benzoate, polyvinyl hydroxyl benzene, or a polymer containing a monomer unit with a carboxyl group.

As described before, the insulation layers 127a in the VA and the barrier layer 127b may be formed simultaneously during exposure and development, after the insulation layer is formed on the window member 111.

In another embodiment of the present disclosure, second wires 129b may be formed on the surface of the barrier layer 127b. The second wires 129b may be formed simultaneously with the sensor patterns 129a. The second wires 129b may transfer a signal independently of the first wires 125a. In an embodiment of the present disclosure, the first and second wires 125a and 129b may simultaneously transmit a signal received from the sensor layer 102a, in synchronization with each other, thereby reducing line resistance. A low line resistance of a transmission line enables high-speed operations and thus may contribute to increasing the response speed of the touch panel 102.

A method for fabricating the touch panel 102 will be described with reference to FIG. 8.

Figure 8:
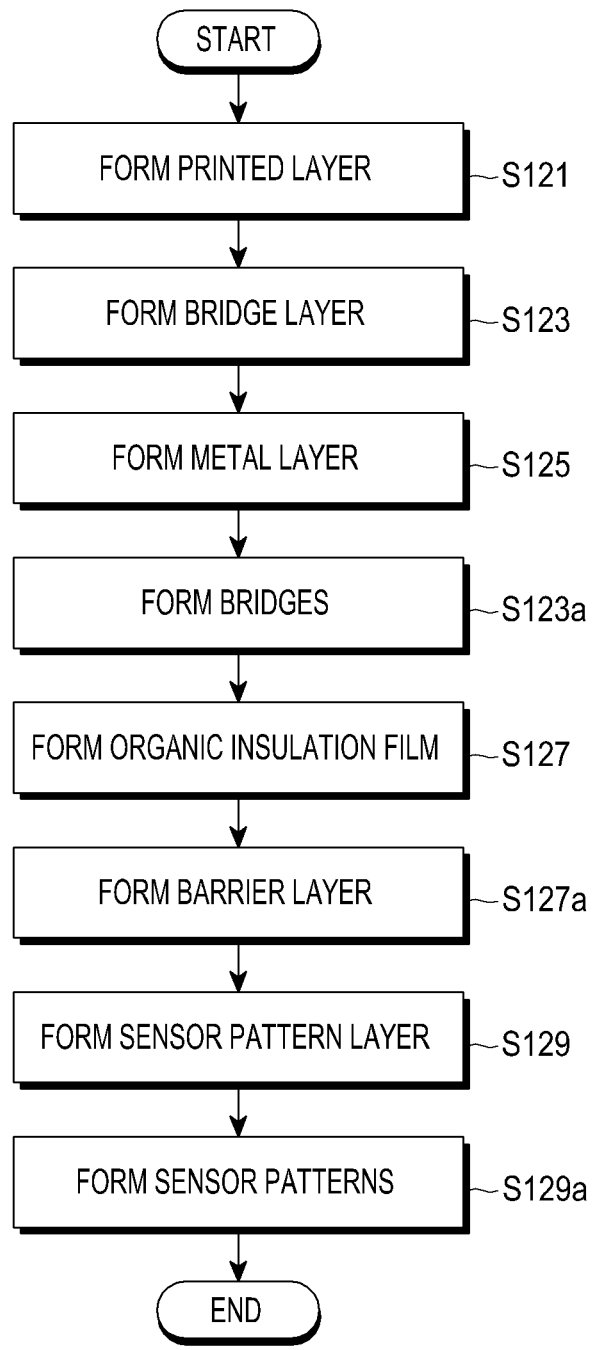
FIG. 8 is a flowchart illustrating a method for fabricating a touch panel according to an embodiment of the present disclosure.
Figure 9:
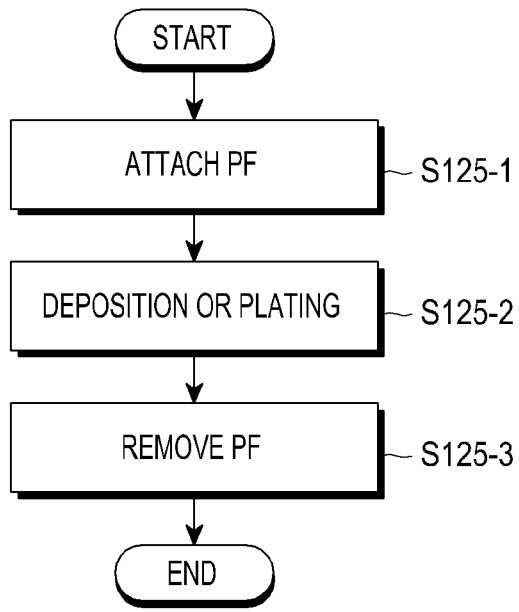
FIG. 9 is a flowchart illustrating an operation for forming a metal layer of a touch panel according to an embodiment of the present disclosure.
Figure 10:
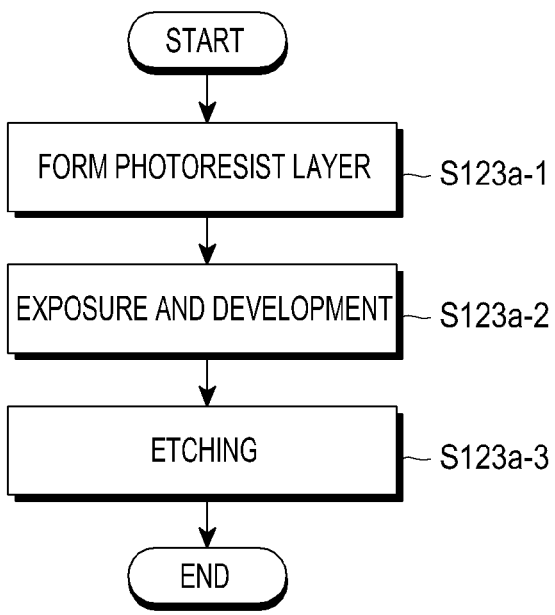
FIG. 10 is a flowchart illustrating an operation for forming bridges of touch panel according to an embodiment of the present disclosure.
Figure 11:
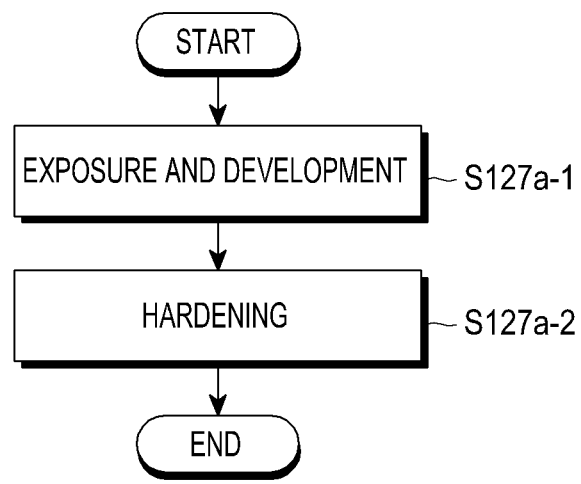
FIG. 11 is a flowchart illustrating an operation for forming a barrier layer of a touch panel according to an embodiment of the present disclosure.

FIG. 8 is a flowchart illustrating a method for fabricating a touch panel according to an embodiment of the present disclosure. FIG. 9 is a flowchart illustrating an operation for forming a metal layer of a touch panel according to an embodiment of the present disclosure. FIG. 10 is a flowchart illustrating an operation for forming bridges of a touch panel according to an embodiment of the present disclosure. FIG. 11 is a flowchart illustrating an operation for forming a barrier layer of a touch panel according to an embodiment of the present disclosure. FIGS. 12 to 22 sequentially illustrate an operation for fabricating a touch panel according to an embodiment of the present disclosure.

In a method for fabricating the touch panel 102 according to an embodiment of the present disclosure, since a metal layer is formed on the surface of the light blocking layer 121 formed in the BA of the window member 111 and an insulation layer, for example, the barrier layer 127*b* is formed on the metal layer, the barrier layer 127*b* may prevent etching of the metal layer in a wiring part, despite surface defects 125*b* of the light blocking layer 121. The barrier layer 127*b* may be formed in correspondence with a wiring pattern to be formed on the light blocking layer 121.

The fabrication method may include an operation for forming the light blocking layer 121 around the VA on a surface of the window member 111, an operation for forming a bridge layer 123 of a transparent conductor on the surface of the window member 111, an operation for forming a metal layer on a surface of the bridge layer 123 on the light blocking layer 121, an operation for forming the bridges 123*a* in the VA of the window member 111 by partially removing the bridge layer 123, and an operation for forming an insulation layer in the VA and on a surface of the metal layer.

Figure 12:
FIGS. 12, 13, 14, 15, 16, 17, 18, 19, 20, 21, and 22 illustrate an operation for fabricating a touch panel according to an embodiment of the present disclosure.

Referring to FIG. 8, the light blocking layer 121 is formed in the BA on a surface of the window member 111 in operation S121. The light blocking layer 121 may be formed by screen printing. An ink for the screen printing may contain a resin such as polyethylene, acryl, polyurethane, or the like and may further contain a pigment for CMF. While the light blocking layer 121 is formed by screen printing in an embodiment of the present disclosure, this should not be construed as limiting the scope of the present disclosure. Formation of the light blocking layer 121 on the window member 111 is illustrated in FIG. 12.

Figure 13:
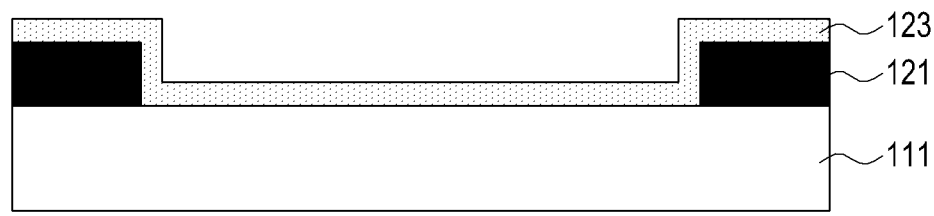

In operation S123, the bridge layer 123 is formed on the surface of the window member 111 having the light blocking layer 121 formed thereon. The bridge layer 123 may be formed on the surface of the light blocking layer 121 as well as on the surface of the window member 111 in the VA. The bridge layer 123 may be formed by vacuum-depositing or plating a transparent conductor such as Indium-Tin Oxide (ITO). The vacuum deposition may be performed by e-beam deposition, sputtering deposition, or the like. Formation of the bridge layer 123 is illustrated in FIG. 13.

In operation S125, a metal layer 125' is formed by depositing or plating metal particles on the light blocking layer 121, for example, on the surface of the bridge layer 123 in the BA. The metal layer 125' may contain a conductive metal such as copper or gold. The first wires 125*a* or the pad electrodes 125*a*-1 in the VA may be formed of the transparent conductor used for the bridge layer 123 and the deposition of the metal layer 125' may reduce line resistance.

A more detailed description will be given of the operation for forming the metal layer 125' with reference to FIG. 9.

Figure 14:
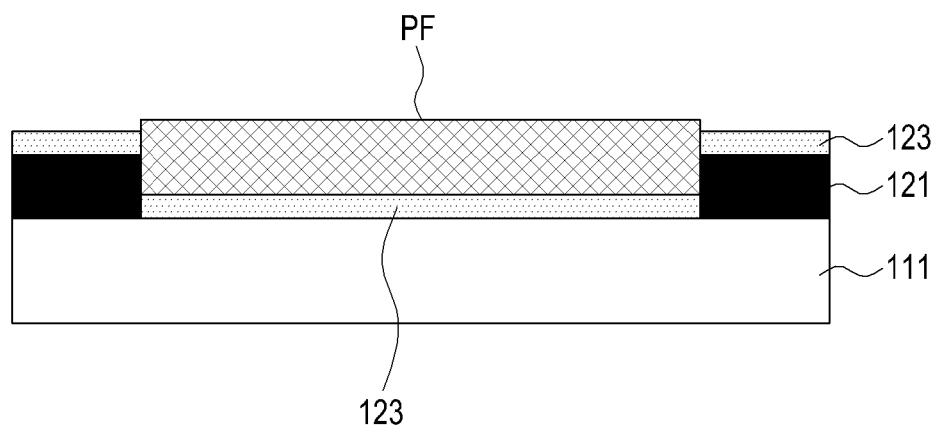

Referring to FIG. 9, a masking member, for example, a Peelable Film (PF), is attached onto the surface of the window member 111 having the bridge layer 123 formed thereon in operation S125-1. Attachment of the PF is illustrated in FIG. 14. The PF may be confined to a part of the surface of the window member 111, for example, to the VA.

Figure 15:
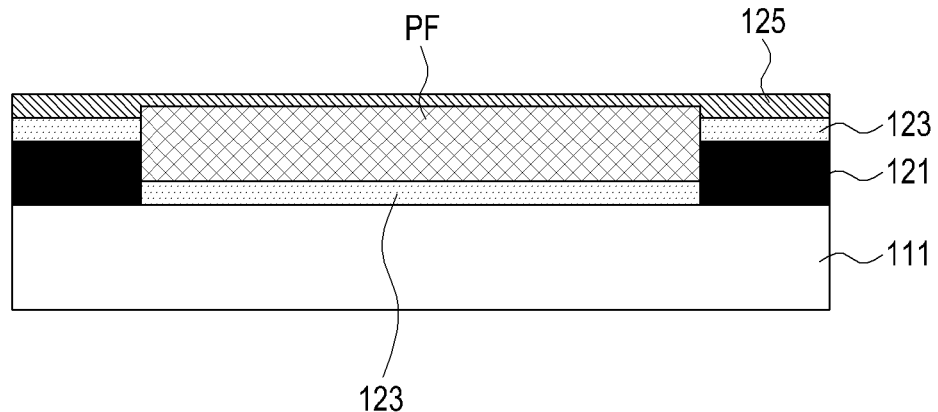

In operation S125-2, metal particles are deposited or plated on the surface of the window member 111 having the PF attached thereon. A metal particle film 125 may be formed on the surface of the PF and the surface of the bridge layer 123 on the light blocking layer 121. The metal particle film 125 may be formed of a conductive metal such as gold or copper. Formation of the metal particle film 125 is illustrated in FIG. 15.

Figure 16:
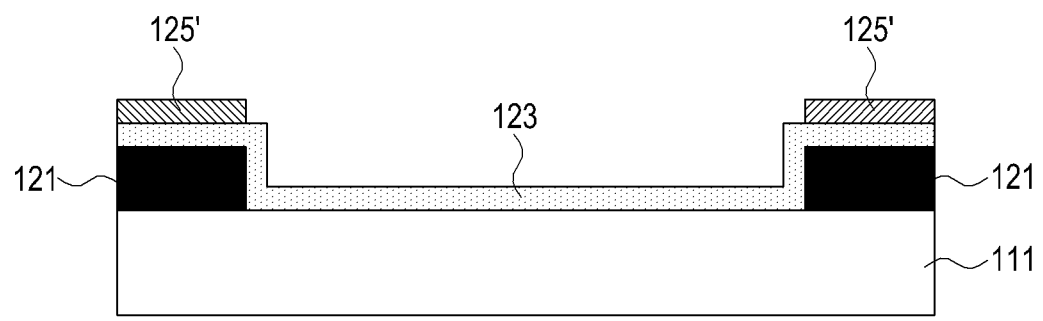

In operation S125-3, the PF is removed after the metal particle film 125 is formed. After the PF is removed, the metal particle film 125 is removed from the VA and the metal layer 125' is completed in the BA, for example, on the surface of the bridge layer 123 on the light blocking layer 121. Completion of the metal layer 125' is illustrated in FIG. 16.

Even though the light blocking layer 121 has surface defects 125*b* such as foreign materials or bumps created during drying or curing, the bridge layer 123 or the metal layer 125' may be formed to a uniform thickness along the surface topology of the light blocking layer 121.

With continued reference to FIG. 8, the bridges 123*a* are formed by partially removing the transparent conductor of the bridge layer 123 in operation S123*a*. The bridges 123*a* may be formed by wet etching.

Referring to FIG. 10, the bridges 123*a* may be formed by forming a photoresist layer on the surface of the bridge layer 123, forming an etching mask PR1 by exposure and development, and partially removing the bridge layer 123 together with the etching mask PR1 using an etching solution.

Figure 17:
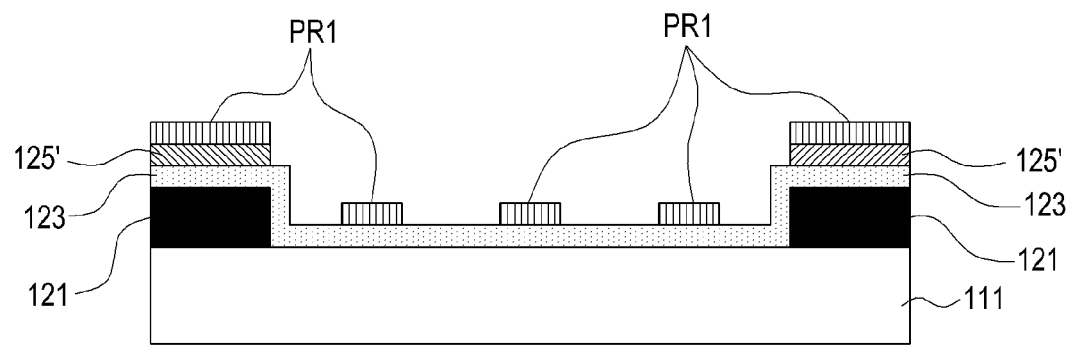

In operation S123*a*-1, the photoresist layer is formed by depositing and hardening a photoresist on the surfaces of the bridge layer 123 and the metal layer 125'. Then, an etching mask PR1 is formed in a pattern by exposure and development, for example, by allowing the photoresist layer to remain at positions where the bridges 123*a* are to be formed in the VA and on the surface of the metal layer 125' in operation S123*a*-2. Formation of the etching mask PR1 on the surfaces of the metal layer 125' and the bridge layer 123 is illustrated in FIG. 17.

Figure 18:
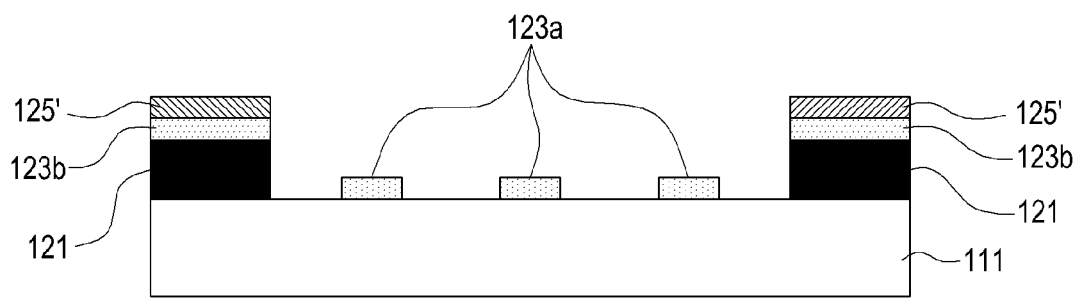

In operation S123*a*-3, a part of the bridge layer 123 in the VA, for example, a part of the bridge layer 123 exposed by the etching mask PR1 is removed using an etching solution. During this operation, the etching mask PR1 may also be removed. In an embodiment of the present disclosure, the etching mask PR1 may be removed by an additional process. Formation of the bridges 123*a* and removal of the etching mask PR1 are illustrated in FIG. 18.

Figure 19:
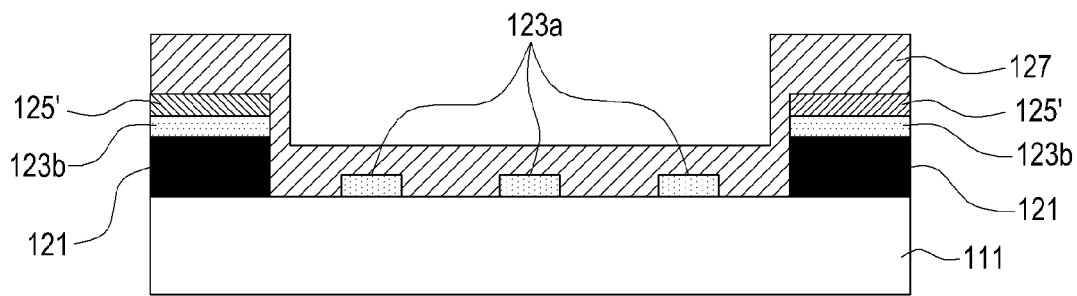

In operation S127, an insulation layer 127 is formed on the surface of the window member 111 having the bridges 123*a* formed thereon. The insulation layer 127 may be formed of a photosensitive organic insulation material. Formation of the insulation layer 127 on the surface of the window member 111 is illustrated in FIG. 19. The insulation layer 127 may be chemical-proof and etch-proof against the etching solution used to etch the transparent conductor or the conductive metal of the bridge layer 123 or the metal layer 125'.

In operation S127*a*, the barrier layers 127*b* are formed on the metal layer 125' by partially removing the insulation layer 127. The insulation layers 127*a* may be formed simultaneously on the bridges 123*a* in operation S127*a*.

Referring to FIG. 11, the barrier layer 127*b* may be formed by exposure, development, and hardening.

Operation S127a-1 is an exposure and development operation. An optical mask is disposed on the insulation layer 127 and then the insulation layer 127 is partially removed by projecting light, for example, UV light onto the optical mask and then applying a development solution. Thus, the insulation layers 127a are formed at parts corresponding to the bridges 123a and the barrier layer 127b is formed on the metal layer 125'. The barrier layer 127b may be formed in a pattern corresponding to the first wires 125a. After the barrier layer 127 is formed in an intended pattern, the barrier layer 127 may be hardened in operation S127a-2.

Figure 20:
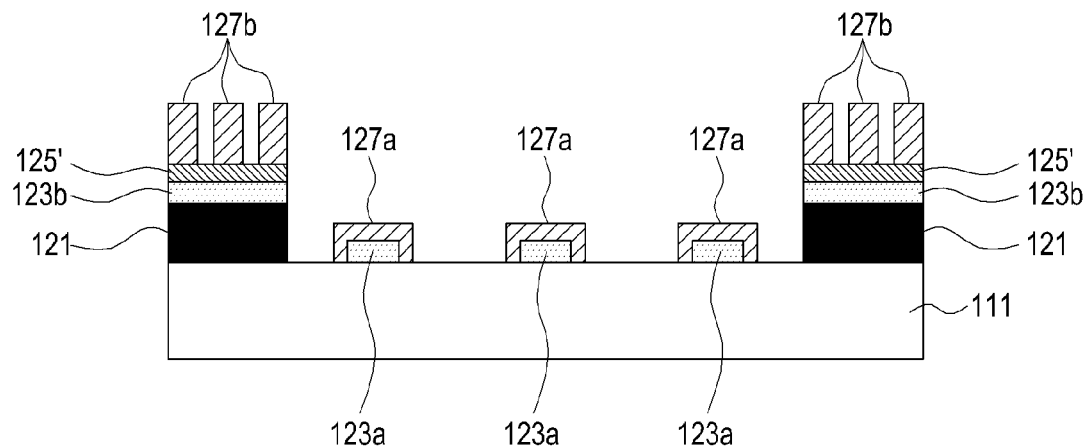

When the first wires 125a and the pad electrodes 125a-1 are formed by partially removing the metal layer 125' and the bridge layer 123 on the light blocking layer 121, the barrier layer 127b may be used as an etching mask. This is because the organic insulation material of the barrier layer 127b is chemical-proof and etching-proof against the etching solution used to etch the metal layer 125' and the bridge layer 123a and 123b. Formation of the insulation layers 127a and the barrier layer 127b is illustrated in FIG. 20.

Figure 21:
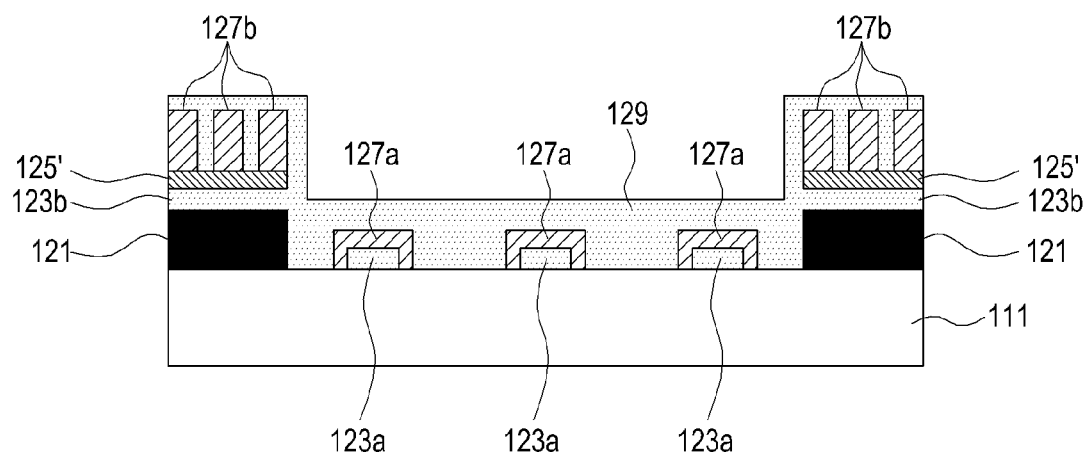

With continued reference to FIG. 8, a sensor pattern layer 129 is formed on the surface of the window member 111 in operation S129. The sensor pattern layer 129 is formed by depositing or plating a transparent conductor on the surface of the window member 111, as illustrated in FIG. 21. The sensor pattern layer 129 is formed in a similar manner to formation of the bridge layer 123 and thus will not be described herein in detail.

Figure 22:
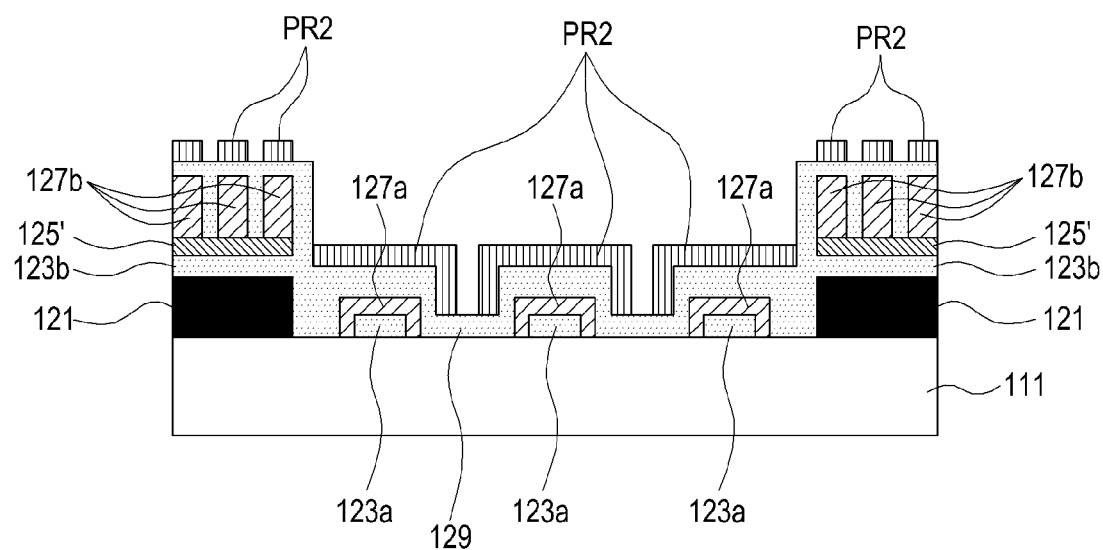

The sensor patterns 129a are formed by partially removing the sensor pattern layer 129 in operation S129a. The sensor patterns 129a are formed in a similar manner to formation of the bridges 123a. For example, after a photoresist layer is formed on the surface of the sensor pattern layer 129, an etching mask PR2 is formed by exposing and developing the photoresist layer. Then, the sensor patterns 129a may be formed by wet etching using the etching mask PR2. Formation of the etching mask PR2 on the sensor pattern layer 129 is illustrated in FIG. 22 and formation of the sensor patterns 129a is illustrated in FIG. 7.

Meanwhile, the sensor pattern layer 129 may also be formed on the surface of the barrier layer 127b. In operation S129a, the second wires 129b may be formed by partially removing the sensor pattern layer 129 on the surface of the barrier layer 127b. The second wires 129b may be arranged independently of the first wires 125a or may be connected to the first wires 125a according to the pattern of the etching mask PR2.

In the process of forming the sensor patterns 129a by etching the sensor pattern layer 129, the bridge layer 123 and the metal layer 125' on the light blocking layer 121 may also be etched partially. As a result, the first wires 125a may be formed on the light blocking layer 121, as illustrated in FIG. 3 or FIG. 7. Because the barrier layer 127b is chemical-proof and etch-proof against an etching solution used to etch the sensor pattern layer 129, the barrier layer 127b may be used as an etching mask for the bridge layer 123 and the metal layer 125'.

The barrier layer 127b is formed to be thick enough to cover the surface defects 125b of the light blocking layer 121, thereby preventing the metal layer 125' or the bridge layer 123 corresponding to parts at which the first wires 125a or the pad electrodes 125a-1 are to be formed from being exposed to an etching solution. Therefore, the quality of the first wires 125a for transmitting a signal output from the sensor layer 102a may be ensured and thus the line width of the first wires 125a or the gap between the first wires 125a may be reduced. Consequently, a narrow bezel may be achieved by narrowing the BA. Furthermore, since a signal transmission line is stably secured irrespective of the quality of the surface of the light blocking layer 121, the CMF of the window member 111 may be diversified using the light blocking layer 121.

As is apparent from the foregoing description, when various looks are to be achieved for a window member by forming a light blocking layer, for example, a printed layer in a BA of the window member, good quality can be ensured for wiring electrodes irrespective of surface defects of the light blocking layer, while a touch panel is integrated into the window member. In addition, since good quality can be ensured for the wiring electrodes, the line width and interval of the wiring electrodes can be reduced. The resulting narrow BA for the wiring electrode arrangement enables formation of a narrow bezel.

While it has been described in the foregoing various embodiments of the present disclosure that after the bridge layer 123 is formed, a metal layer is formed in the BA with a masking member attached, and the bridges 123a are formed after removing the masking member, the metal layer may be formed in the BA after the bridges 123a are formed by partially removing the bridge layer 123.

Therefore, the fabrication method of the present disclosure may be performed in various manners according to a relationship between components and a manufacturing environment, not limited to the order of the afore-described fabrication operations.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A touch panel comprising:
   a window member including a view area and a bezel area surrounding the view area;
   a sensor layer formed in the view area on a surface of the window member and including a sensor pattern for detecting a user input;
   a light blocking layer formed in the bezel area on the surface of the window member;
   a wiring layer formed on a surface of the light blocking layer and including first wires connected to the sensor pattern;
   a barrier layer formed on the surface of the light blocking layer or a surface of the wiring layer; and
   second wires formed on a surface of the barrier layer connected to the sensor pattern.

2. The touch panel of claim 1, wherein the wiring layer includes a first wire extended from the sensor pattern and a pad electrode connected to the sensor pattern through the first wire.

3. The touch panel of claim 1, wherein the barrier layer comprises an insulation layer.

4. The touch panel of claim 1, wherein the sensor pattern comprises a transparent conductor or a metal mesh.

5. The touch panel of claim 1, wherein the wiring layer comprises at least one of a transparent conductor and a conductive metal.

6. An electronic device comprising:
   a touch panel, including:
      a window member including a view area and a bezel area surrounding the view area;

a sensor layer formed in the view area on a surface of the window member and including a sensor pattern for detecting a user input;

a light blocking layer formed in the bezel area on the surface of the window member;

a wiring layer formed on a surface of the light blocking layer and including first wires connected to the sensor pattern;

a barrier layer formed on the surface of the light blocking layer or a surface of the wiring layer; and second wires formed on a surface of the barrier layer connected to the sensor pattern.

7. The electronic device of claim 6, wherein the wiring layer includes a first wire extended from the sensor pattern and a pad electrode connected to the sensor pattern through the first wire.

8. The electronic device of claim 6, wherein the barrier layer comprises an insulation layer.

9. The electronic device of claim 6, wherein the sensor pattern comprises a transparent conductor or a metal mesh.

10. The electronic device of claim 6, wherein the wiring layer comprises at least one of a transparent conductor and a conductive metal.

11. A method for fabricating a touch panel, the method comprising:

forming a light blocking layer around a view area on a surface of a window member;

forming a bridge layer of a transparent conductor on the surface of the window member;

forming a metal layer on a surface of the bridge layer on the light blocking layer;

forming bridges in the view area of the window member by partially removing the bridge layer; and forming an insulation layer in the view area and a surface of the metal layer.

12. The method of claim 11, wherein the formation of the metal layer comprises:

placing a masking member on the surface of the bridge layer in the view area of the window member;

forming a metal layer on the masking member and on the surface of the bridge layer on the light blocking layer; and removing the masking member, wherein when the masking member is removed, the metal layer is removed from the view area of the window member and the metal layer is completed on the surface of the bridge layer on the light blocking layer.

13. The method of claim 11, wherein the formation of the bridges comprises:

forming a photoresist layer on the surfaces of the metal layer and the bridge layer;

partially removing the photoresist layer by exposure and development; and removing an exposed bridge layer and a remaining photoresist layer.

14. The method of claim 11, further comprising forming a barrier layer corresponding to the bridges and the metal layer by partially removing the insulation layer.

15. The method of claim 14, wherein the formation of the barrier layer comprises:

partially removing the insulation layer by exposure and development; and hardening a remaining insulation layer.

16. The method of claim 14, further comprising:

forming a sensor pattern layer of a transparent conductor on the surface of the window member having the barrier layer formed thereon; and forming first sensor patterns connected through the bridges and second sensor patterns crossing the first sensor patterns with the barrier layer in between.

17. The method of claim 16, wherein when the bridge layer and the metal layer on the light blocking layer are partially removed during the formation of the first and second sensor patterns, first wires extended from the first and second sensor patterns and pad electrodes connected to the first and second sensor patterns through the first wires are formed.

18. The method of claim 16, wherein second wires are formed of the sensor pattern layer on the surface of the barrier layer on the light blocking layer during the formation of the first and second sensor patterns.

* * * * *